United States Patent
Chason et al.

(10) Patent No.: US 6,800,946 B2
(45) Date of Patent: Oct. 5, 2004

(54) SELECTIVE UNDERFILL FOR FLIP CHIPS AND FLIP-CHIP ASSEMBLIES

(75) Inventors: Marc Chason, Schaumburg, IL (US); Jan Danvir, Arlington Heights, IL (US)

(73) Assignee: Motorola, Inc, Arlington Heights, IL (US)

( * ) Notice: Subject to any disclaimer, the term of this patent is extended or adjusted under 35 U.S.C. 154(b) by 35 days.

(21) Appl. No.: 10/328,326

(22) Filed: Dec. 23, 2002

(65) Prior Publication Data
US 2004/0118599 A1 Jun. 24, 2004

(51) Int. Cl.$^7$ .......................................... H01L 31/0203
(52) U.S. Cl. ...................... 257/778; 257/100; 257/416; 257/433; 257/787; 438/25; 438/26; 438/51; 438/64; 438/108; 438/126; 29/841
(58) Field of Search .................................... 257/100, 416, 257/433, 434, 680, 681, 778, 787; 438/25–28, 51, 64–67, 108, 116, 126, 127; 310/313 R, 340; 29/841

(56) References Cited
U.S. PATENT DOCUMENTS

| | | | | |
|---|---|---|---|---|
| 5,867,368 A | * | 2/1999 | Glenn | 361/783 |
| 5,969,461 A | * | 10/1999 | Anderson et al. | 310/313 R |
| 6,140,144 A | * | 10/2000 | Najafi et al. | 438/53 |
| 6,365,441 B1 | | 4/2002 | Raiser et al. | |
| 6,490,166 B1 | * | 12/2002 | Ramalingam et al. | 361/760 |
| 6,566,170 B1 | * | 5/2003 | Marion et al. | 438/126 |
| 6,700,068 B2 | * | 3/2004 | Hoffmeyer et al. | 174/250 |
| 2002/0037138 A1 | | 3/2002 | Kaneko et al. | |

\* cited by examiner

Primary Examiner—John B. Vigushin
(74) Attorney, Agent, or Firm—Cardinal Law Group

(57) ABSTRACT

The invention provides a method for attaching a flip chip to a printed wiring board. A bumped opto-electronic or electromechanical flip chip is provided. An underfill material is applied to a first portion of the flip chip, wherein a second portion of the flip chip is free of the underfill material. The flip chip is positioned on a printed wiring board, and a bumped portion of the flip chip is heated to electrically connect the flip chip to the printed wiring board. The second portion of the flip chip remains free of the underfill material when the flip chip is electrically connected to the printed wiring board.

40 Claims, 3 Drawing Sheets

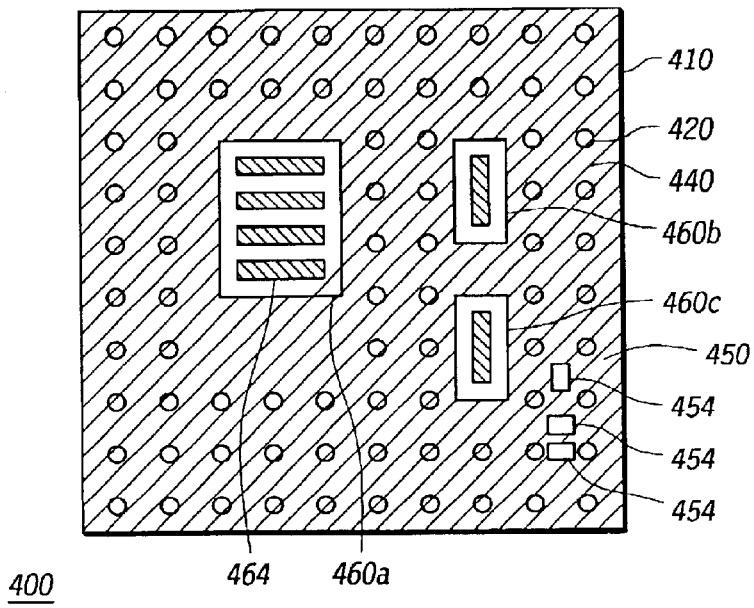
*FIG. 4*
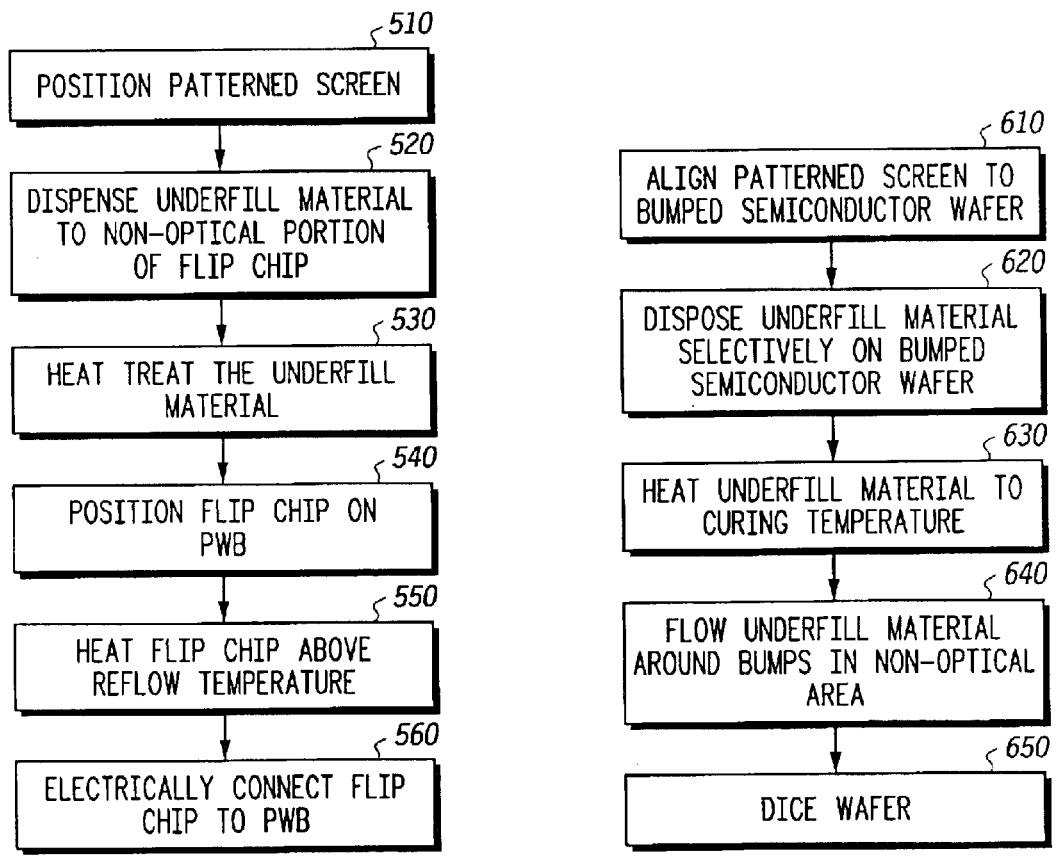
*FIG. 5*      *FIG. 6*

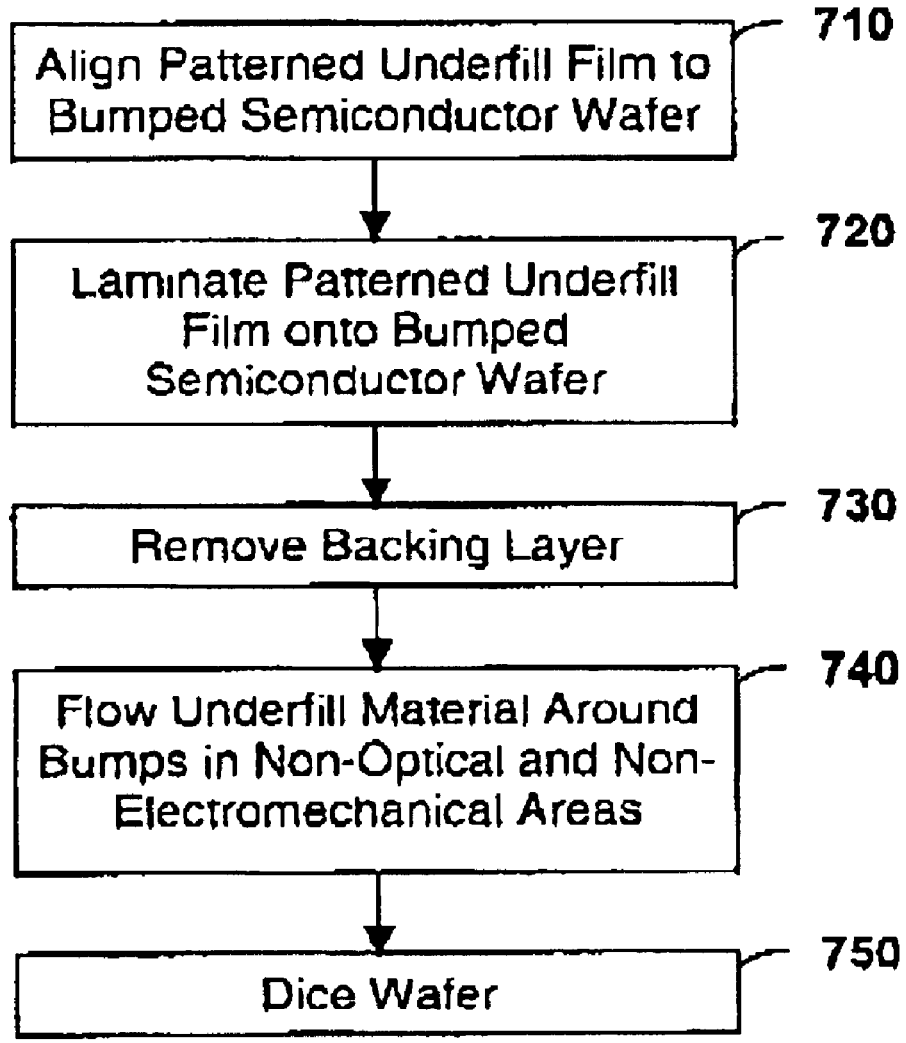

SELECTIVE UNDERFILL FOR FLIP CHIPS AND FLIP-CHIP ASSEMBLIES

FIELD OF THE INVENTION

This invention relates generally to semiconductor wafer processing and integrated circuit packaging. In particular, the invention relates to a selective underfill for opto-electronic and electromechanical bumped semiconductor wafers, flip chips and flip-chip assemblies, and a method for manufacturing a semiconductor wafer, flip chip or a flip-chip module with selective underfill.

BACKGROUND OF THE INVENTION

Assembly of opto-electronic and electromechanical assemblies to printed wiring boards (PWB) is becoming increasingly important as discrete components are integrated to form cost-effective modules. Superior performance can be realized using flip-chip attachment technologies to drive small size. Since opto-electronic integrated circuits (ICs) contain light-emitting and light-detecting components that function between the die and the PWB, assembly technologies that block the light path to the light emitter or detector cannot be used. Flip-hip assembly technologies typically require underfill materials to bond the flip chip to the PWB, and these may block the light path. The underfill material structurally reinforces the solder bumps, mechanically adheres the flip chip to the PWB, and improves the reliability of the assembly.

Electromechanical devices such as surface acoustic wave (SAW) devices, micro-electro-mechanical system (MEMS) devices, integrated electromechanical devices, and other devices with movable parts may function in a degraded manner or not function at all if covered with an underfill material. These devices must remain free of underfill material when bumped and used in flip-chip assemblies.

In technologies of prior art, underfill materials are typically applied to the entire surface of the IC interface. In the liquid underfill dispense technique, the underfill is applied at the edges of the flip-chip bonded die and capillary action wicks the fluid under the die. During this process, the entire die surface is coated with the underfill. When using highly viscous, no-flow underfills, the underfill may be applied to the PWB prior to die placement. During solder reflow, the underfill liquifies and wets the entire die surface. In both cases, the underfill covers the entire die surface and interferes with light propagation between the die emitter and the die detector. If the underfill material is opaque and covers the optical elements, no radiation is transmitted. If transparent materials are used, defects such as bubbles, voids, particles or pockets of air next to the flip chip or printed wiring board may distort or inhibit the transmission of light. The transparent materials may degrade with time. Undue dispersion of light may occur with filler materials included within the underfill material for thermal coefficient of expansion matching. Electromechanical devices with mechanically or acoustically moving structures such as piezoelectric devices or surface-micromachined relays can have no underfill material covering the electromechanical element without impairing operation of the device.

An underfill material may be applied around the periphery of the flip-chip assembly and partially wicked into the interior region, leaving portions of the flip chip free of the underfill material, as described in U.S. Pat. No. 6,365,441, "Partial Underfill for Flip Chip Electronic Packages" issued Apr. 2, 2002. As described in US published application US 2002/0037138, "Optical Module and Method for Manufacturing Same" published Mar. 28, 2002, a transparent underfill resin with an index of refraction less than the index of a waveguide cladding is used as an underfill material between optical devices on a flip chip and a printed wiring board. Other manufacturers may use solder bumps without the use of any underfill material to provide for unimpeded optical transmission between an optoelectronic device on the flip chip and a microlens, waveguide, or other optical element on a printed wiring board, though forfeit the attendant advantages of underfill use.

It would be beneficial to have a packaging technology for directly attaching opto-electronic flip chips to an underlying package substrate or PWB that allows secure electrical and mechanical die attach to the PWB while retaining optically unimpeded optical transmission paths between the flip-chip and the PWB. The packaging technology would allow the flip chip to be bonded effectively to a substrate, with highly reliable electrical interconnections and protective underfill material for secure die bonding, stress relief for the bumps and effective environmental protection, while retaining unrestricted free-space transmission characteristics between associated optical devices. It would be critical for electromechanical flip chips to be attached to a substrate or PWB without impeding movement of the flip chip when bonded to the PWB or package substrate.

It is an object of this invention, therefore, to provide a method for attaching bumped opto-electronic and electromechanical flip chips to a printed wiring board. It is another object of this invention to provide a flip-chip assembly with optical portions and electromechanical portions of the flip-chip assembly free from any underfill material. It is yet another object of this invention to provide a selective underfill process for bumped opto-electronic flip chips and bumped electromechanical flip chips at the die or wafer level, and to overcome other deficiencies and obstacles described above.

SUMMARY OF THE INVENTION

One aspect of the invention provides a method for attaching a flip chip to a printed wiring board. An underfill material is applied to a first portion of a bumped flip chip, maintaining an optical portion or an electromechanical portion of the flip chip free of the underfill material. The flip chip with the selective underfill is positioned on a printed wiring board, and heated to electrically and mechanically connect the flip chip to the printed wiring board while the optical portion or electromechanical portion of the flip chip remains free of the underfill material.

Another aspect of the present invention is a flip-chip assembly, including a bumped flip chip with a first portion and a second portion, and an underfill material selectively disposed on the first portion of the flip chip. The second portion of the flip chip may contain one or more optical devices or electromechanical devices. The second portion of the flip chip remains free from the underfill material when the flip chip is placed on a printed wiring board and heated to electrically connect the flip chip to the printed wiring board. The flip-chip assembly may include a printed wiring board, wherein an active surface of the flip chip is positioned and secured to the printed wiring board, with at least one opto-electronic device on the flip chip optically coupled to an associated device on the printed wiring board.

Another aspect of the invention is a selective underfill process. A bumped semiconductor wafer including at least one opto-electronic device or electromechanical device and at least one solder bump is aligned to a patterned mask. The patterned mask includes at least one barrier feature corresponding to at least one opto-electronic or electromechanical device. An underfill material is dispensed through the patterned mask onto the bumped semiconductor wafer, keeping the opto-electronic and electromechanical devices free of the underfill material. The underfill material is heated to flow the underfill material around the solder bumps, while the opto-electronic or electromechanical device remains free from the underfill material.

Another aspect of the invention is a selective underfill process based on a patterned underfill film. A bumped semiconductor wafer including at least one opto-electronic device or electromechanical device and at least one solder bump is aligned to the patterned underfill film, the patterned underfill film including a backing layer and an underfill material disposed on the backing layer with at least one open feature in the underfill material corresponding to the opto-electronic or electromechanical device. The patterned underfill film is laminated to the bumped semiconductor wafer, the backing layer is removed, and the underfill material is heated to flow the material around the at least one solder bump.

BRIEF DESCRIPTION OF THE DRAWINGS

The present invention is illustrated by the accompanying drawings of various embodiments and the detailed description given below. The drawings should not be taken to limit the invention to the specific embodiments, but are for explanation and understanding. The detailed description and drawings are merely illustrative of the invention rather than limiting, the scope of the invention being defined by the appended claims and equivalents thereof. The foregoing aspects and other attendant advantages of the present invention will become more readily appreciated by the detailed description taken in conjunction with the accompanying drawings, wherein:

FIG. 4 illustrates a plan view of a bumped opto-electronic or electromechanical flip chip with selective underfill, in accordance with one embodiment of the current invention;

FIG. 5 illustrates a block diagram of a method for attaching an opto-electronic or electromechanical flip chip to a printed wiring board, in accordance with one embodiment of the current invention;

FIG. 6 illustrates a block diagram of a selective underfill process, in accordance with one embodiment of the current invention; and FIG. 7 illustrates a block diagram of a selective underfill process, in accordance with another embodiment of the current invention.

DETAILED DESCRIPTION OF THE PRESENTLY PREFERRED EMBODIMENTS

The present invention provides an opto-electronic or electromechanical flip-chip assembly with selective underfill. One aspect of the invention is a method for attaching an opto-electronic or electromechanical flip-chip to a printed wiring board. The flip-chip underfill assembly process selectively disposes an underfill material on a non-optical portion and non-electromechanical portion of the flip chip. The underfill material is limited from covering certain regions of the die. During the flip-chip underfill process, the underfill material may be placed on the die surface over non-optical and non-electromechanical portions of the die. The underfill material is omitted over optical devices and opto-electronic devices such as light emitters and detectors where the underfill material could limit or prohibit the transmission of light between the flip chip and the substrate or printed wiring board. The underfill material may also be restricted from other areas of the die or wafer, such as the die streets or on top of the solder bumps, or from selected regions of solder bumps on the flip chip. By restricting the underfill material from coating the optically-active portions of the die, the opto-electronic die with selective underfill can be flip-chip assembled to a PWB using underfill materials, preserving the attendant benefits of underfill without inhibiting optical transmissions between the flip chip and the PWB. By restricting the underfill material from coating the electromechanical portions of the die, the characteristics of the electromechanical devices are not degraded.

The underfill material has sufficient viscosity during application to the flip chip so that selected regions of the die are left open and free of the underfill material. During solder reflow, the underfill material may flow outwardly to form a fillet at the die edges, although it does not collapse internally around the optically active areas. Fillets may also be formed at the interior edges of the underfill material. The invention can be applied to any opto-electronic assembly that requires the opto-electronic die to be flip-chip assembled using underfill. The invention can also be applied to any electromechanical assembly that requires the electromechanical die to be flip-chip assembled using underfill. The underfill material after reflow provides additional bond strength between the bumped flip chip and the printed wiring board, and provides strain relief for the electrically connected flip chip.

Figure 1:
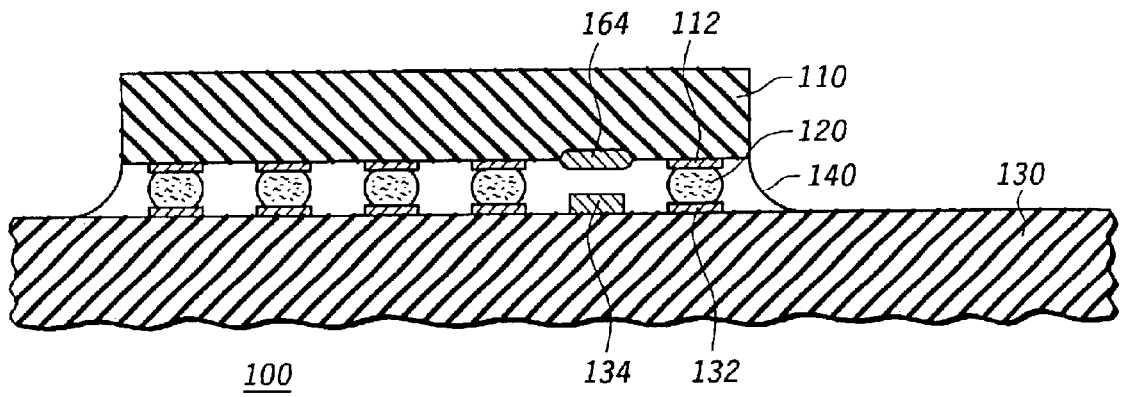
FIG. 1 illustrates an opto-electronic flip-chip assembly with non-selective underfill, as is typical in the prior art.

FIG. 1 illustrates an opto-electronic flip-chip assembly with non-selective underfill, as is typical in the prior art. Flip-chip assembly 100 includes a flip chip 110 with an array of solder bumps 120 attached to a substrate 130 using a non-selective underfill material 140. Flip chip 110 may include a series of electronic devices, electrical interconnect traces, electrical vias, and an arrangement of flip-chip pads 112. Flip chip 110 may also contain one or more opto-electronic devices 164. Solder balls or solder bumps 120 are formed on flip-chip pads 112 using metal deposition, metal electroplating, solder ball placement, or other bump-formation processes as currently known in the art. Solder bumps 120 may be positioned against substrate 130 and heated above the eutectic point of the solder to melt them and connect them to substrate 130. Substrate 130 contains an array of interconnect traces and substrate pads 132 for electrically connecting the flip chip to the substrate. Substrate 130 may also include one or more substrate optical devices 134 corresponding to flip-chip opto-electronic devices 164. Substrate 130 may also include electronic components, optical components, and other flip chips.

After the solder reflow, solder bumps 120 are electrically, mechanically and metallurgically connected to substrate 130 through flip-chip pads 112 and substrate pads 132. Non-selective underfill material 140 provides additional bonding strength for the die attach. Non-selective underfill material 140 also provides stress relief at the solder ball interfaces during temperature excursions of the flip-chip assembly, and provides environmental protection from moisture, particles, and other contamination that may degrade the performance of the flip chip. The underfill material may be applied to the flip chip before the reflow step, or applied to the periphery of the flip chip after reflow is completed and then wicked into the region between the surface of the flip chip and the substrate to bond them together and provide protection. Non-selective underfill material 140 is also located between flip-chip opto-electronic devices 164 and substrate optical devices 134. This underfill process is not selective, and does not provide an unimpeded optical path between opto-electronic devices on the flip chip and corresponding devices on the substrate for free-space transmission of optical signals. To transfer optical energy between flip chip 110 and substrate 130, non-selective underfill material 140 must be nominally transparent over the wavelengths of interest and be free of any defects including non-transparent fragments, voids, and other optical deformities. Filler materials incorporated into non-selective underfill material 140 for TCE-matching considerations must not scatter or disperse the transmission of light unduly. Alternatively, the underfill material may be omitted completely, though at the loss of attendant benefits.

Figure 2:
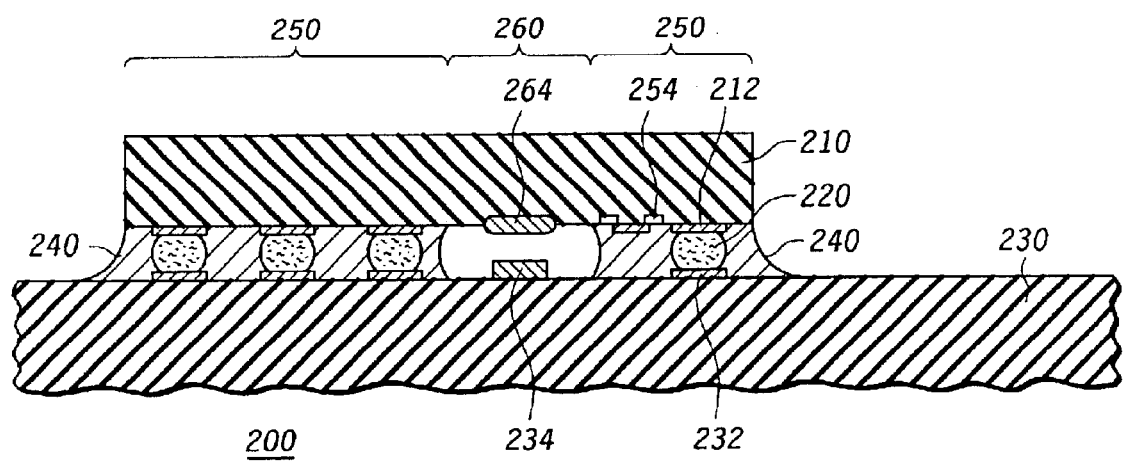
FIG. 2 illustrates an opto-electronic or electromechanical flip-chip assembly with selective underfill, in accordance with one embodiment of the current invention.

FIG. 2 illustrates one embodiment of an opto-electronic or electromechanical flip-chip assembly with selective underfill, in accordance with the present invention at 200. Selective underfill flip-chip assembly 200 includes one or more opto-electronic or electromechanical flip chips 210 containing at least one solder ball or solder bump 220 electrically connected to a substrate or printed wiring board (PWB) 230, and selective underfill material 240 between the bumped surface of flip chip 210 and PWB 230.

Flip chip 210 may contain a multitude of active components, passive components, or any combination thereof. Flip chip 210 may contain electronic components such as resistors, capacitors, and transistors. These components may be integrated onto flip chip 210. Flip chip 210 may contain one or more integrated circuits. Flip chip 210 may include a set of electrical interconnect traces and flip-chip pads 212. Flip chip 210 may contain one or more optical devices in optical or electromechanical portion 260. Flip chip 210 may contain one or more opto-electronic or electromechanical devices 264 such as a photodiode, a photo detector, a photodiode array, or a photodetector array. Flip chip 210 may contain one or more light-emitting diodes, semiconductor lasers, vertical-cavity surface emitting lasers, edge-emitting lasers, a photo emitter, a light emitter, or a light detector. Flip chip 210 may contain one or more passive optical devices such as an optical waveguide, a refractive element such as a microlens or a microlens array, a reflective element such as a mirror, or an optical element. Flip chip 210 may contain any combination of these active and passive elements.

Alternatively, flip chip 210 may contain one or more electromechanical devices in electromechanical portion 260. Flip chip 210 may contain one or more electromechanical devices such as an electromechanical filter, an electromechanical relay, an acoustic emitter, an acoustic detector, a surface acoustic wave device, a bulk acoustic wave device, a thin-film mechanical element, a microfluidic device, or a micro-electro-mechanical device. In this exemplary embodiment of the present invention, flip chip 210 is a bumped opto-electronic flip chip or a bumped electromechanical flip chip. Flip chip 210 may include at least one solder bump or at least one solder ball on the active surface of the flip chip. The solder balls or solder bumps 220 are typically formed by metal depositions, metal electroplating, solder ball placement, or other bump-formation processes as currently known in the art. Solder balls or solder bumps 220 may be positioned against PWB 230 and heated to melt them and to connect them to PWB 230. PWB 230 may contain an array of interconnect traces and substrate pads 232 for electrically connecting flip chip 210 to PWB 230. PWB 230 may contain one or more active and passive devices bonded to PWB 230 or formed on PWB 230. PWB 230 may be a printed circuit board. The printed wiring board may be a single or multi-layer fiberglass FR4 board, an organic circuit board, or a motherboard. PWB 230 may be an opto-electronic module, an electromechanical module, a ceramic substrate, a hybrid circuit substrate, a package substrate, or a semiconductor substrate such as a silicon substrate or a compound semiconductor substrate. PWB 230 may be a polyimide tape, a flex circuit, a high-density interconnect board, an electromechanical circuit board, or an opto-electronic circuit board. An active surface of flip chip 210 may be positioned and secured to PWB 230, and at least one opto-electronic device on the flip chip is optically coupled to an associated device on PWB 230.

PWB 230 of one embodiment includes one or more substrate optical devices 234 corresponding to flip-chip opto-electronic or electromechanical devices 264. Substrate optical device 234 may be a photodiode, a photo detector, a photodiode array, a photodetector array, a light-emitting diode, a semiconductor laser, a vertical-cavity surface emitting laser, an edge-emitting laser, a photo emitter, a light emitter, a light detector, an optical waveguide, a refractive element, a reflective element, an optical element, or any combination thereof. For example, a VCSEL laser on flip chip 210 may be optically aligned to a photo detector or a passive optical waveguide on PWB 230. PWB 230 may contain apertures and multiple layers with waveguides, prisms, mirrors, and other optical elements.

Selective underfill material 240 may be located or disposed on a non-optical and non-electromechanical portion 250 of flip chip 210. Non-optical and non-electromechanical portion 250 may contain one or more passive or active electronic devices 254. Selective underfill material 240 may be omitted from one or more optical or electromechanical portions 260 of flip chip 210. One or more optical or electromechanical portions 260 of flip chip 210 may be free of selective underfill material 240 when flip chip 210 is placed on a printed wiring board and heated to electrically connect flip chip 210 to PWB 230. Optical or electromechanical portion 260 may include at least one optical or electromechanical devices 264. Not all optical and electromechanical portions 260 of flip chip 210 need to be free of selective underfill material 240, if the optical or electromechanical devices are not negatively impacted by the underfill material or have no corresponding element on PWB 230.

Selective underfill material 240 may comprise a filled epoxy, such as a one or two part epoxy that contains insulating microspheres to separate flip chip 210 from PWB 230 during die attach processes. Fillers may be added to the selective underfill material to improve thermal expansion characteristics of the underfill material. Selective underfill material 240 may include an epoxy, a thermoplastic material, a thermoset material, polyimide, polyurethane, a polymeric material, a filled epoxy, a filled thermoplastic material, a filled thermoset material, filled polyimide, filled polyurethane, a filled polymeric material, or any suitable underfill compound.

Figure 3:
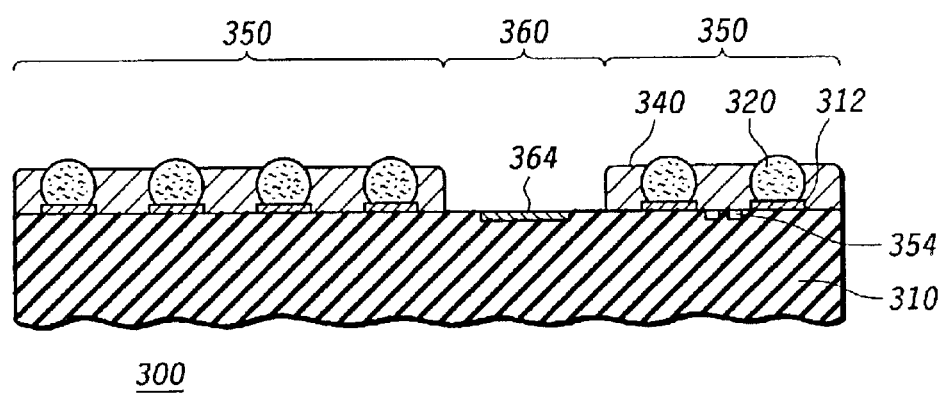
FIG. 3 illustrates a cross-sectional view of a bumped opto-electronic or electromechanical flip chip with selective underfill, in accordance with one embodiment of the current invention.

FIG. 3 shows a cross-sectional view of a bumped opto-electronic or electromechanical flip chip with selective underfill, in accordance with one embodiment of the present invention at 300. Bumped opto-electronic or electromechanical flip chip with selective underfill 300 may include bumped flip chip 310 with bumps 320, and selective underfill material 340. Bumps 320 may be solder bumps or solder balls on an active surface of flip chip 310. Bumps 320 may be connected to flip chip 310 at flip-chip pads 312. Flip-chip pads 312 may be connected to electrical, electronic, and optical devices on flip chip 310 with one or more on-chip interconnect traces.

Bumped opto-electronic or electromechanical flip chip with selective underfill 300 often includes a non-optical and non-electromechanical portion 350 and an optical or electromechanical portion 360. Non-optical and non-electromechanical portion 350 may include one or more passive or active electronic devices 354. Bumped flip chip 310 may include at least one optical or electromechanical device 364. Optical portion 360 may include at least one optical or electromechanical device 364. Optical device 364 may be a photodiode, a photo detector, a photodiode array, a photodetector array, a light-emitting diode, a semiconductor laser, a vertical-cavity surface emitting laser, an edge-emitting laser, a photo emitter, a light emitter, a light detector, an optical waveguide, a refractive element, a reflective element, an optical element, or any combination thereof. Electromechanical device 364 may be an electromechanical filter, an electromechanical relay, an acoustic emitter, an acoustic detector, a surface acoustic wave device, a bulk acoustic wave device, a thin-film mechanical element, a microfluidic device, or a micro-electromechanical device.

Selective underfill material 340 may be located on non-optical and non-electromechanical portions 350, while optical or electromechanical portions 360 of flip chip 310 are free of underfill material 340. Underfill material 340 may include a filled epoxy, such as an epoxy filled with glass or insulating microspheres. Underfill material 340 may be an epoxy, a thermoplastic material, a thermoset material, polyimide, polyurethane, a polymeric material, a filled thermoplastic material, a filled thermoset material, filled polyimide, filled polyurethane, a filled polymeric material, or any suitable underfill compound. The underfill material may be disposed on non-optical and non-electromechanical portion 350 of flip chip 310. Underfill material 340 may be a thickness less than a height of bumps 320. Underfill material 340 may be thicker than one-half of the bump thickness and less than the height of the bumps. Underfill material 340 may be thicker than the height of the bumps, provided that good electrical connection can be made to flip chip 310 when reflowed. Underfill material 340 may be a transparent material, a semi-transparent material, or a non-transparent material, since optical portions of flip chip 310 are free of the material and the non-optical portions of the flip chip are not impacted by transmissivity of the underfill material. Underfill material 340 may provide strain relief for electrically connected flip chip 310.

FIG. 4 shows a plan view of a bumped opto-electronic or electromechanical flip chip with selective underfill, in accordance with one embodiment of the present invention at 400. Bumped flip chip 400 includes an opto-electronic or electromechanical flip chip 410, an array of flip-chip bumps 420, and selective underfill material 440. Bumped flip chip 400 includes a non-optical and non-electromechanical portion 450 and one or more optical or electromechanical portions 460a, 460b and 460c. Non-optical and non-electromechanical portion 450 may include one or more active or passive electronic devices 454. Optical or electromechanical portions 460a, 460b and 460c may include one or more optical or electromechanical devices 464.

Opto-electronic or electromechanical flip chip 410 may include any combination of active and passive electronic and optical devices, such as a photodiode, a photo detector, a photodiode array, a photodetector array, a light-emitting diode, a semiconductor laser, a vertical-cavity surface emitting laser, an edge-emitting laser, a photo emitter, a light emitter, a light detector, an optical waveguide, a refractive element, a reflective element, an optical element, or any combination thereof. Opto-electronic flip chip 410 includes at least one solder bump or at least one solder ball on an active surface of the flip chip. Electromechanical flip chip 410 may include any combination of active and passive electronic devices, and one or more electromechanical devices such as an electromechanical filter, an electromechanical relay, an acoustic emitter, an acoustic detector, a surface acoustic wave device, a bulk acoustic wave device, a thin-film mechanical element, a microfluidic device, and a micro-electromechanical device.

Flip-chip bumps 420 may be formed on opto-electronic or electromechanical flip chip 410 using deposited metals, electroplated metals, solder ball placement techniques, or any suitable solder ball or solder bump process as is known in the art.

Underfill material 440 is selectively disposed on non-optical and non-electromechanical portions of opto-electronic or electromechanical flip chip 410. Underfill material 440 may be a thickness less than the height of at least one bump. Underfill material 440 may cover or partially cover flip-chip bumps 420. Underfill material 440 may be transparent, partially transparent, or opaque over the wavelengths of interest. Underfill material 440 provides strain relief for the electrically connected flip chip. Underfill material 440 typically includes an epoxy, a thermoplastic material, a thermoset material, polyimide, polyurethane, a polymeric material, a filled thermoplastic material, a filled thermoset material, filled polyimide, filled polyurethane, a filled polymeric material, or any suitable underfill compound.

FIG. 5 shows a block diagram of a method for attaching an opto-electronic or electromechanical flip chip to a printed wiring board, in accordance with one embodiment of the present invention at 500. Flip-chip attachment method 500, also referred to as prime chip attach, comprises steps to apply a selective underfill material to a bumped opto-electronic or electromechanical flip chip and to attach the flip chip to a printed wiring board. The flip chip includes at least one optical or electromechanical device located in an optical or electromechanical portion of the flip chip. The optical device may include a photodiode, a photo detector, a photodiode array, a photodetector array, a light-emitting diode, a semiconductor laser, a vertical-cavity surface emitting laser, an edge-emitting laser, a photo emitter, a light emitter, a light detector, an optical waveguide, a refractive element, a reflective element, an optical element, or any combinations thereof. The electromechanical device may include an electromechanical filter, an electromechanical relay, an acoustic emitter, an acoustic detector, a surface acoustic wave device, a bulk acoustic wave device, a thin-film mechanical element, a microfluidic device, or any micro-electro-mechanical device.

In an exemplary embodiment of the present invention, a bumped opto-electronic or electromechanical flip chip is provided. A patterned mask is positioned against a bumped surface of the opto-electronic or electromechanical flip chip, as seen at block 510. The opto-electronic or electromechanical flip chip typically contains one or more solder bumps or solder balls on the active surface of the flip chip. The patterned mask may comprise a fine-mesh screen with one or more barrier features on the screen. The barrier features may include features that cover optical and electromechanical portions of the flip chip. The patterned mask may include barrier features over the streets when wafer-level underfill is applied. Alternatively, the patterned mask may be a stencil with holes and other features punched or formed in a sheet of material such as plastic or metal. Material such as gels, suspensions, slurries and viscous liquids may be pressed through the open mask areas to leave a thin coat of material on the underlying substrate. An underfill material may be applied to a non-optical and non-electromechanical portion of the flip chip, wherein one or more optical or electromechanical portions of the flip chip are kept free of the underfill material. The underfill material may then be dried and stabilized, partially cured, or otherwise solidified.

The underfill material may be dispensed through the patterned mask onto one or more non-optical and non-electromechanical portions of the flip chip, as seen at block 520. The underfill material may include an epoxy, a thermoplastic material, a thermoset material, polyimide, polyurethane, a polymeric material, a filled thermoplastic material, a filled thermoset material, filled polyimide, filled polyurethane, a filled polymeric material, or any suitable underfill compound. The underfill material may be transparent, semi-transparent or non-transparent over the wavelengths of interest. The underfill material may be dispensed to a thickness up to the thickness of the bumps on the flip chip. The underfill material may be dispensed to a thickness greater than the thickness of the bumps to cover the bumps, provided that the underfill material will soften and allow the bumps to be electrically connected to the printed wiring board during reflow.

The underfill material may be heat-treated, as seen at block 530. The underfill material is heated to flow the underfill material around the solder bumps, while the opto-electronic and electromechanical devices remain free from the underfill material. The viscosity of the underfill material may be selected such that the underfill material flows adequately around the bumps, though does not flow into the optical or electromechanical regions of the flip chip. The underfill material may be heated to a predefined temperature to drive out solvents and solidify the material though not necessarily cure it. Underfill materials based on epoxies and other polymeric materials may be heated to an underfill material staging temperature to dry the underfill such that the underfill is no longer tacky. The underfill material may be dried and remain uncured or be partially cured after the heating step. The underfill material staging temperature may be between, for example, 80 degrees centigrade and 150 degrees centigrade. The heat-treatment step may be done in a controlled environment such as air, nitrogen, or vacuum. Staging temperatures are typically sustained for 30 minutes to over 2 hours.

Alternatively, the underfill material may be applied to the non-optical and non-electromechanical portions of the flip chip using a die-cut film, a laminate of an underfill material and a backing layer, or other sheet form of patterned underfill material. The die-cut film or patterned underfill film may be aligned to the bumped flip chip, positioned against the bumped surface of the flip chip, and pressed onto the flip chip while heating to adhere the underfill material to the flip chip. The backing layer may then be removed. In another embodiment, the region between the patterned underfill film may be pumped out to remove air between the patterned underfill film and the flip chip, then the underfill material is heated with the flip chip to adhere the selective underfill to the flip chip.

After heat-treating or drying the underfill material, the flip chip may be positioned on a printed wiring board so that an optical device on the flip chip aligns to a corresponding optical device on the printed wiring board, as seen at block 540. The printed wiring board may be a single layer or multi-layer FR4 board, an organic circuit board, a motherboard, an opto-electronic module, an electromechanical module, a ceramic substrate, a hybrid circuit substrate, a package substrate, a semiconductor substrate, a polyimide tape, a flex circuit, a high-density interconnect board, an electromechanical circuit board, or an opto-electronic circuit board.

The flip-chip bumps may be heated to or above a reflow temperature of the bumped opto-electronic or electromechanical flip chip to electrically and mechanically connect the flip chip to the printed wiring board, as seen at block 550. When above the reflow temperature, the solder bumps will liquefy and become soldered to the printed wiring board. After a dwell time of, for example, 20 seconds to two minutes or more, the heat source may be removed and the flip-chip assembly cooled to room temperature. The reflow temperature, for example, may be between 183 degrees centigrade and 220 degrees centigrade for lead-tin solder bumps. The reflow temperature, for example, may be between 220 degrees centigrade and 250 degrees centigrade for lead-free or low lead-content bumps. The reflow temperature may extend as low as 160 degrees centigrade or lower for the case of low-temperature solders based on indium or other materials.

The devices on the flip chip become electrically and mechanically connected to the printed wiring board after the heating step, as seen at block 560. The optical and electromechanical portions of the flip chip remain free of the underfill material. The underfill material provides strain relief for the electrically connected flip chip. An encapsulant or other suitable protective material may subsequently encase the flip-chip assembly. In some cases, a post-cure step may be incorporated. The selective underfill may be heated to an underfill post-cure temperature of between, for example, 100 degrees centigrade and 150 degrees centigrade, for a time on the order of 15 to 30 minutes.

FIG. 6 shows a block diagram of a selective underfill process, in accordance with one embodiment of the present invention at 600. Selective underfill process 600, also referred to as wafer-applied underfill, comprises steps to selectively dispense underfill material on a provided bumped semiconductor wafer or a bumped flip chip. The bumped semiconductor wafer may contain an array of bumped flip chips. The semiconductor wafer includes at least one solder bump or solder ball and at least one opto-electronic or electromechanical device. The semiconductor wafer may comprise a silicon wafer with at least one opto-electronic or electromechanical device. The semiconductor wafer may comprise gallium arsenide, gallium nitride, indium phosphide, or other suitable opto-electronic semiconductor material.

To dispense the underfill material, a patterned mask may be aligned to the bumped semiconductor wafer or flip chip, as seen at block 610. The underfill material may be dispensed selectively onto the bumped semiconductor wafer through areas of the mask not blocked by any barrier features on the mask. The patterned mask includes at least one barrier feature corresponding to one or more opto-electronic or electromechanical devices.

The underfill material can be dispensed through the patterned mask onto the bumped semiconductor wafer, where the opto-electronic and electromechanical devices remain free from the underfill material as seen at block 620. With this method, other wafer-level features such as dicing streets can also be kept free of underfill material. Other processes may be used to deposit the underfill material, such as writing with a pen system or a needle dispensing system, or using an inkjet nozzle.

The underfill material is typically heated to dry the underfill material, as seen at block 630. The underfill material may be heated to or above an underfill material staging temperature. The underfill material staging temperature is typically between 80 degrees centigrade and 150 degrees centigrade. Drying times may be between two minutes and twenty minutes or longer. The underfill material may partially cure during this step.

In this exemplary embodiment, the underfill material is heated to flow the underfill material around the solder bumps in non-optical and non-electromechanical areas during the staging cycle or during a partial curing cycle to flow the material around the solder bumps, while the opto-electronic devices remain free from the underfill material, as seen at block 640. The underfill material may be softened and flowed to provide good adhesion and coverage of the bumps. Typically when staging cycles are used, the cycles may be greater than ten minutes to over two hours at a temperature up to 150 degrees centigrade or higher in an air, nitrogen, or other controlled environment.

The bumped semiconductor wafer may be diced to form individual flip chips, as seen at block 650. The flip chips have bumps and selective underfill material, and may be attached to printed wiring boards and other substrates in flip-chip assemblies.

FIG. 7 shows a block diagram of a selective underfill process, in accordance with another embodiment of the present invention at 700. Selective underfill process 700, also referred to as wafer-applied underfill, comprises steps to selectively dispense underfill material on a provided bumped semiconductor wafer or a bumped flip chip, using a patterned underfill film. The bumped semiconductor wafer includes at least one of an opto-electronic device or an electromechanical device, and at least one solder bump. The patterned underfill film may be a die-cut film or a laminate including an underfill material and a release or backing layer.

The patterned underfill film includes a thin layer of underfill material such as an epoxy, a thermoplastic material, a thermoset material, polyimide, polyurethane, a polymeric material, a filled epoxy, a filled thermoplastic material, a filled thermoset material, filled polyimide, filled polyurethane, a filled polymeric material, or any suitable underfill compound. The backing layer may be a transparent plastic, mylar or acetate sheet used to support the underfill material.

Windows, apertures, streets and other features may be formed in the underfill layer. The underfill material may be cut or punched with a die to form prescribed shapes. Alternatively, the underfill material may be selectively ablated with a laser, or fashioned into the desired patterns using any suitable formation technique.

The patterned underfill film is aligned to the surface of a bumped semiconductor wafer, as shown at block 710. At least one open feature in the patterned underfill material is aligned to at least one of an opto-electronic device or an electromechanical device on the bumped wafer.

The patterned underfill film is laminated to the bumped semiconductor wafer, as seen at block 720. The patterned underfill film may be laminated to the bumped semiconductor wafer by pressing the patterned underfill film against the bumped semiconductor wafer when the patterned underfill film and the bumped semiconductor wafer are at a lamination temperature. The lamination temperature may be between 60 degrees centigrade and 100 degrees centigrade, for example. The patterned underfill film may be pressed with a hot roller, with a press, or with any suitable pressing mechanism. Alternatively, the patterned underfill film may be laminated by pumping out the region between the patterned underfill film and the bumped semiconductor wafer to remove trapped air and to firmly hold the patterned underfill film against the bumped semiconductor wafer. The bumped semiconductor wafer and the patterned underfill film may be heated to a lamination temperature such as a temperature between 60 degrees centigrade and 100 degrees centigrade.

The backing layer may be removed, as seen at block 730. The backing layer may be peeled back or otherwise separated from the underfill material and the bumped semiconductor wafer. The underfill material remains laminated to the bumped semiconductor wafer, and the opto-electronic devices or electromechanical devices are free from the underfill material.

The underfill material is flowed around bumps in non-optical and non-electromechanical areas on the bumped semiconductor wafer, as seen at block 740. The underfill material may be heated to a temperature such that the underfill material flows around the bumps, though does not flow into the opto-electronic or electromechanical devices. The opto-electronic devices or electromechanical devices remain free from the underfill material.

The bumped semiconductor wafer with the underfill material may be diced to form individual flip chips, as seen at block 750. The flip chips have bumps and selective underfill material, and may be attached to printed wiring boards and other substrates in flip-chip assemblies.

While the embodiments of the invention disclosed herein are presently preferred, various changes and modifications can be made without departing from the spirit and scope of the invention. The scope of the invention is indicated in the appended claims, and all changes that come within the meaning and range of equivalents are intended to be embraced therein.

What is claimed is:

1. A flip-chip assembly comprising:
   a bumped flip chip including a first portion and a second portion;
   an underfill material disposed on the first portion of the flip chip; and
   a printed wiring board, wherein the second portion of the flip chip remains free from the underfill material when the flip chip is placed on the printed wiring board and heated to electrically connect the flip chip to the printed wiring board, and wherein an active surface of the flip chip is positioned and secured to the printed wiring board, and wherein at least one opto-electronic device in the second portion of the flip chip is optically coupled to an associated device on the printed wiring board.

2. The assembly of claim 1 wherein the flip chip comprises at least one solder bump or at least one solder ball on an active surface of the flip chip.

3. The assembly of claim 1 wherein the second portion of the flip chip comprises at least one optical device.

4. The assembly of claim 3 wherein the optical device is selected from the group consisting of a photodiode, a photo detector, a photodiode array, a photodetector array, a light-emitting diode, a semiconductor laser, a vertical-cavity surface emitting laser, an edge-emitting laser, a photo emitter, a light emitter, a light detector, an optical waveguide, a refractive element, a reflective element, an optical element, and a combination thereof.

5. The assembly of claim 1 wherein the second portion of the flip chip comprises at least one electromechanical device.

6. The assembly of claim 5 wherein the electromechanical device is selected from the group consisting of an electromechanical filter, an electromechanical relay, an acoustic emitter, an acoustic detector, a surface acoustic wave device, a bulk acoustic wave device, a thin-film mechanical element, a microfluidic device, and a micro-electromechanical device.

7. The assembly of claim 1 wherein the underfill material comprises a material selected from the group consisting, of an epoxy, a thermoplastic material, a thermoset material, polyimide, polyurethane, a polymeric material, a filled epoxy, a filled thermoplastic material, a filled thermoset material, filled polyimide, filled polyurethane, a filled polymeric material, and a suitable underfill compound.

8. The assembly of claim 1 wherein the printed wiring board is selected from the group consisting of an FR4 board, an organic circuit board, a motherboard, an opto-electronic module, an electromechanical module, a ceramic substrate, a hybrid circuit substrate, a package substrate, a semiconductor substrate, a polyimide tape, a flex circuit, a high-density interconnect board, an electromechanical circuit board, and an opto-electronic circuit board.

9. A method for attaching a flip chip to a printed wiring board, comprising:
providing a bumped flip chip,
applying an underfill material to a first portion of the flip chip, wherein a second portion of the flip chip is free of the underfill material, and wherein the underfill material is applied by positioning a patterned mask against a bumped surface of the flip chip and dispensing the underfill material through the patterned mask;
positioning the flip chip on the printed wiring board; and
heating a bumped portion of the flip chip to electrically connect the flip chip to the printed wiring board, wherein the second portion of the flip chip remains free of the underfill material when the flip chip is electrically connected to the printed wiring board.

10. The method of claim 9 wherein the bumped flip chip comprises at least one solder bump or at least one solder ball on an active surface of the flip chip.

11. The method of claim 9 wherein the second portion of the flip chip comprises at least one optical device.

12. The method of claim 11 wherein the optical device is selected from the group consisting of a photodiode, a photo detector, a photodiode array, a photodetector array, a light-emitting diode, a semiconductor laser, a vertical-cavity surface emitting laser, an edge-emitting, laser, a photo emitter, a light emitter, a light detector, an optical waveguide, a refractive element, a reflective element, an optical element, and a combination thereof.

13. The method of claim 9 wherein the second portion of the flip chip comprises at least one electromechanical device.

14. The method of claim 13 wherein the electromechanical device is selected from the group consisting of an electromechanical filter, an electromechanical relay, an acoustic emitter, an acoustic detector, a surface acoustic wave device, a bulk acoustic wave device, a thin-film mechanical element, a microfluidic device, and a micro-electromechanical device.

15. The method of claim 9 wherein the underfill material is dispensed to a thickness less than a height of at least one bump.

16. The method of claim 9 wherein the underfill material is non-transparent.

17. The method of claim 9 wherein the underfill material provides strain relief for the electrically connected flip chip.

18. The method of claim 9 wherein the underfill material comprises a material selected from the group consisting of an epoxy, a thermoplastic material, a thermoset material, polyimide, polyurethane, a polymeric material, a filled epoxy, a filled thermoplastic material, a filled thermoset material, filled polyimide, filled polyurethane, a filled polymeric material, and a suitable underfill compound.

19. The method of claim 9 wherein the printed wiring board is selected from the group consisting of an FR4 board, an organic circuit board, a motherboard, an opto-electronic module, an electromechanical module, a ceramic substrate, a hybrid circuit substrate, a package substrate, a semiconductor substrate, a polyimide tape, a flex circuit, a high-density interconnect board, an electromechanical circuit board, and an opto-electronic circuit board.

20. The method of claim 9 wherein the bumped portion of the flip chip is heated to a reflow temperature of the bumped flip chip.

21. A selective underfill process, comprising:
providing a bumped semiconductor wafer, the bumped semiconductor wafer including at least one of an opto-electronic device or an electromechanical device, and at least one solder bump;
aligning a patterned mask to the bumped semiconductor wafer, the patterned mask including at least one barrier feature corresponding to the at least one of an opto-electronic device or an electromechanical device;
dispensing an underfill material through the patterned mask onto the bumped semiconductor wafer, wherein the at least one of an opto-electronic device or an electromechanical device is free from the underfill material; and
heating the underfill material to flow the underfill material around the at least one solder bump, while the at least one of an opto-electronic device or an electromechanical device remains free from the underfill material.

22. The process of claim 21 wherein the bumped semiconductor wafer comprises a silicon wafer containing at least one of an opto-electronic device or an electromechanical device.

23. The process of claim 21 wherein the underfill material is selected from the group consisting of an epoxy, a thermoplastic material, a thermoset material, polyimide, polyurethane, a polymeric material, a filled epoxy, a filled thermoplastic material, a filled thermoset material, filled polyimide, filled polyurethane, a filled polymeric material, and a suitable underfill compound.

24. The process of claim 21 wherein the underfill material is heated to an underfill material staging temperature.

25. A selective underfill process, comprising:
providing a bumped semiconductor wafer, the bumped semiconductor wafer including at least one of an opto-electronic device or an electromechanical device, and at least one solder bump
aligning a patterned underfill film to the bumped semiconductor wafer, the patterned underfill film including a backing layer, an underfill material disposed on the backing layer, and at least one open feature in the underfill material corresponding to the at least one of an opto-electronic device or an electromechanical device;

laminating the patterned underfill film to the bumped semiconductor wafer;

removing the backing layer from the patterned underfill film, wherein the underfill material layer remains laminated to the bumped semiconductor wafer, and the at least one of an opto-electronic device or an electromechanical device is free from the underfill material; and heating the underfill material to flow the underfill material around the at least one solder bump, while the at least one of an opto-electronic device or an electromechanical device remains free from the underfill material.

26. The process of claim 25 wherein the underfill material is selected from the group consisting of an epoxy, a thermoplastic material, a thermoset material, polyimide, polyurethane, a polymeric material, a filled epoxy, a filled thermoplastic material, a filled thermoset material, filled polyimide, filled polyurethane, a filled polymeric material, and a suitable underfill compound.

27. The process of claim 25, wherein laminating the patterned underfill film comprises pressing the patterned underfill film against the bumped semiconductor wafer when the patterned underfill film and the bumped semiconductor wafer are at a lamination temperature.

28. The process of claim 25, wherein laminating the patterned underfill film comprises pumping out a region between the patterned underfill film and the bumped semiconductor wafer, and heating the patterned underfill film and the bumped semiconductor wafer to a lamination temperature.

29. A method for attaching a flip chip to a printed wiring board, comprising:

providing a bumped flip chip;

applying an underfill material to a first portion of the flip chip, wherein a second portion of the flip chip is free of the underfill material, and wherein the underfill material is applied by positioning a patterned underfill film against a bumped surface of the flip chip and pressing the patterned underfill film onto the flip chip;

positioning the flip chip on the printed wiring board; and heating a bumped portion of the flip chip to electrically connect the flip chip to the printed wiring board, wherein the second portion of the flip chip remains free of the underfill material when the flip chip is electrically connected to the printed wiring board.

30. The method of claim 29 wherein the bumped flip chip comprises at least one solder bump or at least one solder ball on an active surface of the flip chip.

31. The method of claim 29 wherein the second portion of the flip chip comprises at least one optical device.

32. The method of claim 31 wherein the optical device is selected from the group consisting of a photodiode, a photo detector, a photodiode array, a photodetector array, a light-emitting diode, a semiconductor laser, a vertical-cavity surface emitting laser, an edge-emitting laser, a photo emitter, a light emitter, a light detector, an optical waveguide, a refractive element, a reflective element, an optical element, and a combination thereof.

33. The method of claim 29 wherein the second portion of the flip chip comprises at least one electromechanical device.

34. The method of claim 33 wherein the electromechanical device is selected from the group consisting of an electromechanical filter, an electromechanical relay, an acoustic emitter, an acoustic detector, a surface acoustic wave device, a bulk acoustic wave device, a thin-film mechanical element, a microfluidic device, and a micro-electromechanical device.

35. The method of claim 29 wherein the underfill material is dispensed to a thickness less than a height of at least one bump.

36. The method of claim 29 wherein the underfill material is non-transparent.

37. The method of claim 29 wherein the underfill material provides strain relief for the electrically connected flip chip.

38. The method of claim 29 wherein the underfill material comprises a material selected from the group consisting of an epoxy, a thermoplastic material, a thermoset material, polyimide, polyurethane, a polymeric material, a filled epoxy, a filled thermoplastic material, a filled thermoset material, filled polyimide, filled polyurethane, a filled polymeric material, and a suitable underfill compound.

39. The method of claim 29 wherein the printed wiring board is selected from the group consisting of an FR4 board, an organic circuit board, a motherboard, an opto-electronic module, an electromechanical module, a ceramic substrate, a hybrid circuit substrate, a package substrate, a semiconductor substrate, a polyimide tape, a flex circuit, a high-density interconnect board, an electromechanical circuit board, and an opto-electronic circuit board.

40. The method of claim 29 wherein the bumped portion of the flip chip is heated to a reflow temperature of the bumped flip chip.

* * * * *